United States Patent [19]

Bobeck

[11] 4,355,373
[45] Oct. 19, 1982

[54] MAGNETIC BUBBLE MEMORY
[75] Inventor: Andrew H. Bobeck, Chatham, N.J.
[73] Assignee: Bell Telephone Laboratories, Incorporated, Murray Hill, N.J.
[21] Appl. No.: 209,901
[22] Filed: Nov. 24, 1980
[51] Int. Cl.³ ............................................. G11C 19/08
[52] U.S. Cl. ........................................ 365/39; 365/15
[58] Field of Search ................................... 365/15, 39

[56] References Cited

U.S. PATENT DOCUMENTS

Re. 29,677  6/1978  Bonyhard .............................. 365/15
3,815,107   6/1974  Almasi ................................. 365/39

FOREIGN PATENT DOCUMENTS 55-87377  7/1980  Japan ..................................... 365/43

Primary Examiner—James W. Moffitt
Attorney, Agent, or Firm—Herbert M. Shapiro

[57] ABSTRACT

A new geometry for the propagation elements of a field-access magnetic bubble memory is disclosed which is tolerant of relatively wide gaps between elements and lower drive fields. The elements have shapes which define bubble "traps" operative to hold bubbles for relatively high efficiency transfers between elements. In alternate embodiments, the elements have an L-shape or a "pickaxe" shape.

6 Claims, 5 Drawing Figures

MAGNETIC BUBBLE MEMORY

FIELD OF THE INVENTION

This invention relates to magnetic bubble memories and more particularly to such memories in which bubbles move along a path of magnetically soft elements responsive to a reorienting in-plane magnetic field.

BACKGROUND OF THE INVENTION

Magnetic bubble memories are well known in the art. Bubble propagation is accomplished in such memories by creating a changing pattern of localized magnetic field gradients. U.S. Pat. No. 3,534,347 of A. H. Bobeck issued Oct. 13, 1970 discloses a "field-access" mode bubble memory in which the localized field gradients are produced in a pattern of magnetically soft elements adjacent the bubble layer by a magnetic field rotating in the plane of bubble movement. The elements, typically of Permalloy, have a geometry and orientation such that the rotating in-plane field produces in them consecutively offset positions magnetic poles which attract bubbles and which are operative to move bubbles along a path defined by the elements.

A variety of geometries has been used for the propagation elements of Permalloy field-access bubble memories. The T-bar geometry, disclosed in the above-mentioned patent, was one of the original circuit patterns used. That pattern employs elements oriented at 90 degrees to one another so that each 90 degree rotation of the in-plane field moves the bubble to a new position. Efforts to improve the operating margins of bubble memories have resulted in a number of alternative geometries, including the Y-bar, the asymmetric half-disc, and the presently used asymmetric chevron.

Whatever the geometry of the elements, the propagation path is formed by a series of the elements oriented in such a manner that due to the rotation of the in-plane field and consequent pole formation, a bubble moves to successive positions on an element, and at a certain point, again due to the geometry of the pole formation, transfers to the next adjacent element. In the asymmetric disc or chevron pattern, the bubble lingers near the end of the instant element until it sees a stronger attractive pole on the next adjacent element and then transfers to that element. It is thought to be advantageous for the pole formed on the element to which the bubble transfers to be strong enough to "pull" the bubble over to complete the transfer. This requirement limits the element design of the propagation circuit.

For operative bubble memories, the gap between adjacent elements is typically smaller than the bubble "collapse diameter" and is the limiting feature in bubble memory design. The problem to which this invention is directed thus is to relax the requirements on the gap between adjacent elements in magnetic bubble memories.

BRIEF DESCRIPTION OF THE INVENTION

The present invention is directed at a field-access bubble memory having relatively attractive operating margins. A new mechanism for propagation as well as a new geometry for the propagation elements allows for more efficient transfer of a bubble from one element to the next, makes more efficient use of space for pole formation, allows for relatively wide gaps and permits higher packing densities to be achieved.

The solution to the above problem thus is a unique pattern of elements for a bubble memory which allows gaps much larger than a bubble collapse diameter between adjacent elements.

In one embodiment herein, a propagation element comprises two segments of different lengths oriented at an angle one to another thus forming a long bar section and a shorter end in what may be visualized as a chevron shaped element with a short downstream leg. In forming a propagation path, the elements are oriented diagonally with respect to the direction of the bubble path with the short leg of one element leading directly to the long leg of the next adjacent down stream element.

As with prior art field-access devices, the elements are made of a magnetically soft material, typically Permalloy, responsive to the rotation of an in-plane magnetic field. As the in-plane field rotates, poles form which make the short end act as a bubble "trap". The bubble waits in the trap and is prevented by the shapes of the elements from backwards propagation until the in-plane field switches the magnetization of the long bar section of the elements and the bubble is ejected directly to the next element. At the time of crossing to the next subsequent element, a bubble finds itself midway in a field gradient originating at an upstream portion of the instant element and terminating at the other side of a gap on the next subsequent downstream element. The diagonal orientation of the elements with respect to the direction of propagation allows a relatively large element to be formed within a square area of unit size allotted to a single period of the memory thus achieving relatively strong poles.

In an alternative embodiment, the elements have a "pickaxe" shape. The elements are operative in the same manner, as are the above-mentioned elements, to propagate bubbles. The symmetry of the pickaxe geometry makes these elements particularly suited as a transfer between adjacent paths as is described in copending application Ser. No. 209,900 filed for H. M. Shapiro of even date herewith.

DETAILED DESCRIPTION

Figure 1:
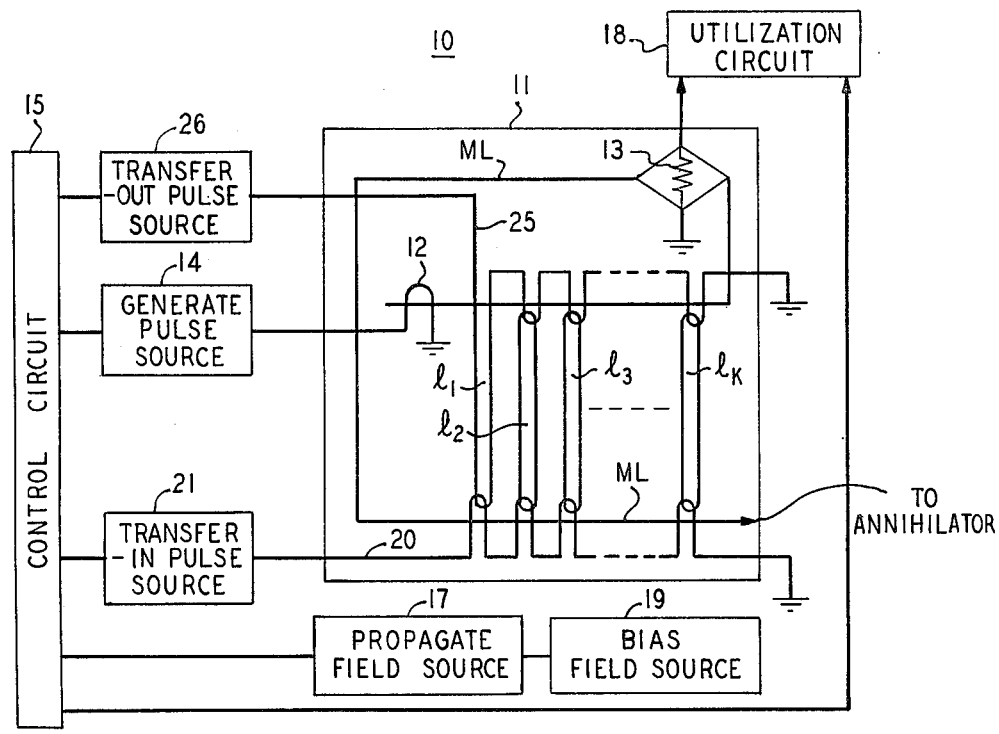
FIG. 1 is a block diagram of a magnetic bubble memory.

FIG. 1 shows a magnetic bubble memory 10 including a host layer 11 of a material in which magnetic bubbles can be moved. Bubbles are moved in layer 11 in closed loops, $l_1$, $l_2$ . . . and $l_k$ which are commonly referred to as minor loops and in addition, in what may be thought of as a single loop ML commonly referred to as a major loop.

Permanent storage of data is provided by the minor loops. The major loop, on the other hand, provides for access to the minor loops of substitute data from a bubble generator 12 and for read out of addressed data at a detector 13. In this connection, generator 12 comprises an electrical conductor connected between a generate pulse source 14 and ground operative under the control of control circuit 15 to provide a pulse selectively during each cycle of a propagation drive circuit represented by block 17. Detector 13 similarly is shown connected between a utilization circuit 18 and ground and may include a magnetoresistance detector element. Bubbles are maintained at a nominal diameter by a bias field supplied by source 19.

We will adopt the convention that data, generated at 12, move counterclockwise about loop ML to locations at the lower ends of minor loops $l_i$ in response to successive propagation cycles of the in-plane field. A transfer-in conductor 20 couples those ends of the minor loops with associated stages of the major loop for transferring new data into the minor loops at the proper time. Conductor 20, to this end, is connected between a transfer-in pulse source 21 and ground as shown.

A similar transfer operation, termed a transfer-out operation, occurs at the top ends of the minor loops as viewed. The transfer-out operation is controlled by a pulse in conductor 25 which is similarly connected between pulse source 26 and ground. The control of the transfer functions as well as the generator, propagation and detector operations is derived from a master clock in accordance with well understood principles. Such circuitry along with an address register is considered to be included within control circuit 15.

The general organization of the memory of FIG. 1 thus can be seen to involve the generation of a bubble pattern at 12 for later storage in the minor loops by the activation of transfer-in conductor 20 during a write operation. Also involved is the transfer-out of addressed data from the minor loops by the activation of transfer-out conductor 25. The data transferred out advances to detector 13 for applying signals representative of the transferred bubble pattern to utilization circuit 18. The data move counterclockwise along loop ML until a later transfer-in operation moves the data back into vacancies at the bottom of the minor loops as viewed.

In this connection, it is helpful to recognize that bubbles usually move synchronously in all the loops of the memory. When a transfer-out operation occurs, vacancies are left in the addressed bit locations in the minor loops. These vacancies move about the minor loops as the transferred data move to detector 13. The number of stages in the minor loops and the number in the major loop are chosen so that data transferred out or data generated at 12 arrive at the lower end of the minor loops synchronously with these vacancies.

We now direct our attention to FIGS. 2A–2E which show a portion of a propagation path of FIG. 1 employing shortened chevron or L-shaped elements. The succession of figures is intended to show a representative portion of an illustrative path with poles formed due to a rotating in-plane field, and the positions occupied by a bubble propagating along this path. In all the FIGS. 2A–2E, the in-plane field rotates clockwise and propagation is to the right.

Figure 2:
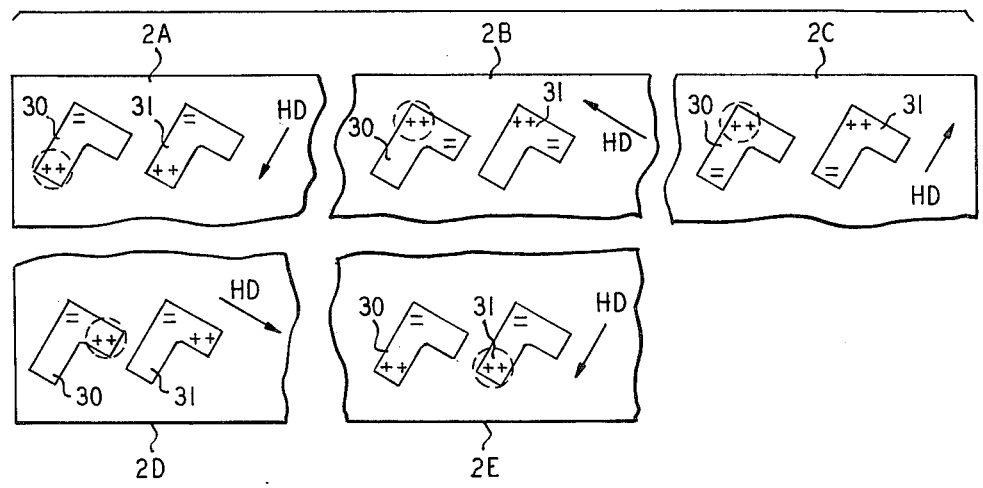
FIGS. 2A, 2B, 2C, 2D, 2E, 3, and 4 are enlarged top views of portions of the memory of the type shown in FIG. 1 showing propagation elements of different embodiments of this invention.

FIG. 2A shows a bubble at an assumed initial position on element 30 where the attractive poles accumulate for the direction in which the in-plane field $H_D$ points. As the in-plane rotates clockwise, a positive pole is created at the top of the element and the bubble moves to occupy the position shown in FIG. 2B. Further rotation of the field by 90 degrees leaves the bubble in the same position while the strong negative pole reorients to the position shown in FIG. 2C. As the in-plane field rotates another 90 degrees, to the orientation shown in FIG. 2D, the bubble moves into the position shown in that figure. This position, at the short end of element 30, constitutes a bubble "trap". The bubble is prevented from backwards propagation by the presence of negative poles, as shown, and waits in the trap until the rotating in-plane field begins to switch the magnetization of the long bar segment of element 30 to that shown in FIG. 2E. At that time, the bubble is ejected from element 30 directly to an awaiting attractive pole formed in element 31 as shown in FIG. 2E. Thus one cycle of drive field advances the bubble one period.

Figure 3:
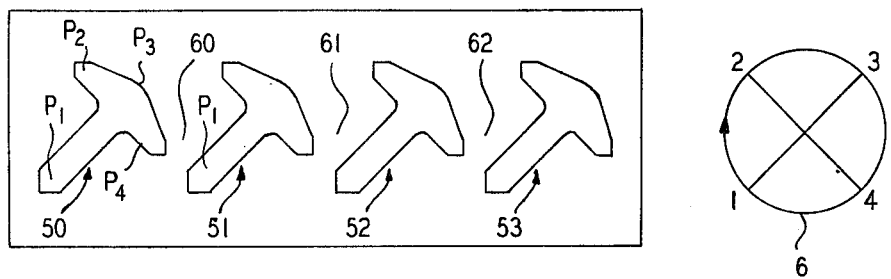

FIG. 3 shows an alternative geometry for the propagation elements of FIGS. 2A to 2E which is a variation of the basic L-shape shown in those figures. Elements 50, 51, 52 and 53 of FIG. 3 have the above-mentioned "pickaxe" shape and are separated by gaps 60, 61 and 62. Propagation of a bubble along these elements is analogous to propagation along the propagation pattern of FIGS. 2A–2E. In response to successive reorientations of the in-plane field as shown in the figure, the bubble moves from positive $P_1$ to $P_2$ to $P_3$ to $P_4$. As the field moves to the "1" orientation, as indicated by curved arrow 63, the bubble is blocked by the repulsive (negative) pole created at $P_2$ (of element 50) from moving backwards along element 50. Element 51 exhibits an attractive (positive) pole at position $P_1$ and so the bubble crosses gap 60 to position $P_1$.

Figure 4:
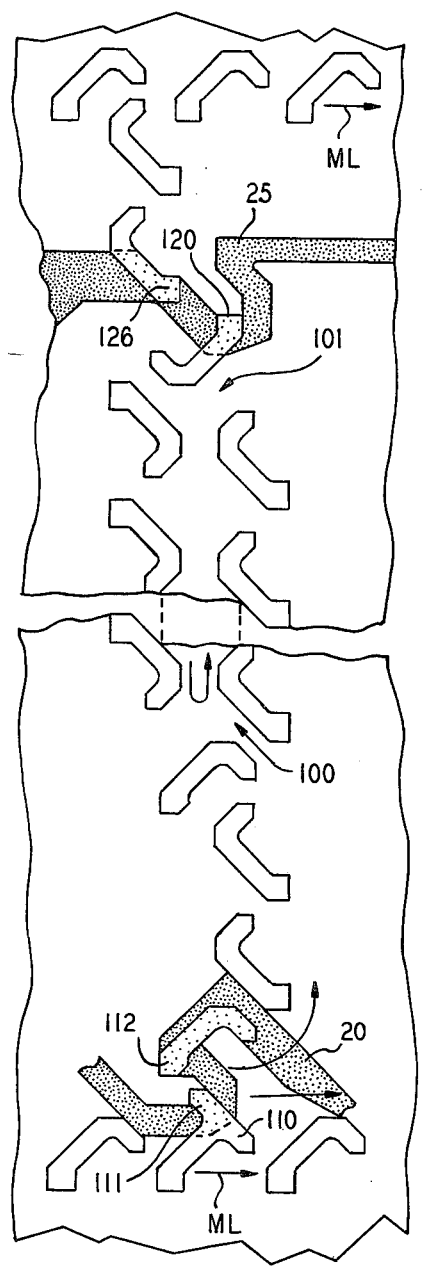

FIG. 4 shows an illustrative minor loop $l_3$ composed of Permalloy elements of still another shape which are operative with relatively wide gaps. The figure also shows transfer-in and transfer-out conductors 20 and 25 for moving bubbles between the major loop ML and the minor loops. Bubble movement is counterclockwise in the minor loops, turns 100 and 101 being defined for such operation.

A transfer operation is carried out in response to a pulse applied to conductor 20 or 25 by source 21 or 26 respectively. A bubble moving from left to right along the lower horizontal leg of path ML of FIG. 1 towards a passive annihilator (guard rail) passes position 110 of FIG. 4 from whence normal rotation of the in-plane field causes the bubble to move to position 111 of FIG. 4. At this juncture in the operation source 21 of FIG. 1 pulses conductor 20 for moving the bubble to position 112 for movement to minor loop $l_3$ during subsequent operation. Similarly, normal propagation counterclockwise about a minor loop such as $l_3$, moves a bubble into position 120 of FIG. 4. At this juncture, source 26 pulses conductor 25 causing the bubble to move to position 126 for subsequent movement to the upper leg of major path ML as viewed in FIG. 4. Consequently, propagation, turns, transfer-in and transfer-out functions can be seen to be implemented with features permissive of wide gaps.

The significance of the embodiments of FIGS. 2A–2E, 3 and 4 lies in the fact that adjacent elements are separated by gaps which can be significantly wider than prior art gaps. It has been accepted in the bubble art that a gap between adjacent elements of a propagation path for bubbles is necessarily small compared to a bubble diameter at the collapse field. It has also been established that a period or distance through which a bubble is moved during a single cycle of the in-plane drive field is large typically four to five times a bubble diameter at the strip-out field. Therefore, for a bubble diameter of normally 1.7 microns ($\mu$), a typical gap is 1.0$\mu$ and the period is 8.0$\mu$. Memories with 8.0$\mu$ periods have recently been introduced commercially.

The reason that 8.0$\mu$ period memories are only now being introduced commercially is that commercially available photolithographic equipment has resolution capabilities of about 1.0μ. Thus the gap separating adjacent elements of a bubble path can (at best) be 1.0μ allowing an 8.0μ period and use of a 1.7μ bubble.

The present invention allows a change to be made in the relationship between the gap width and the bubble diameter. Thus, for example, with presently available 1.0μ photolithography, 4.0μ period circuits can be realized with 1.0μ gaps and 0.8μ bubbles. In view of the fact that one million bit bubble memories with 8.0μ periods are now becoming available, the present invention permits four million bit memories on a like-size chip (approximately 8 millimeters on a side) with the same photolithography.

Memories with higher packing densities, of course, are expected to be realized as increasingly sophisticated equipment becomes available commercially. For example, half micron, and even better resolution is being achieved with photolithographic equipment nearing commercial use. Such equipment would allow prior art bubble memories to be scaled down to 4.0μ periods also. But at the same time that equipment would allow 2.0μ period memories with element patterns defined in accordance with this invention.

Similarly, larger chips allow larger capacity, in contradistinction to higher packing density, by increasing the area of the chips. Large chips are realized by larger furnaces and scaled up chip-handling equipment as well as by processing techniques which reduce the number of defects in the chips. Also, increasingly sophisticated step and repeat cameras reduce distortion and improve alignment capabilities. Whatever improvement is permitted by such equipment an additional factor of four is realized easily in accordance with the teachings of this invention as described hereinbefore.

Further benefits are achieved with the new propagation arrangement herein. Firstly, materials exhibiting 0.1μ bubbles are known. But, of course, no technology existed to realize bubble paths for moving such bubbles. Alternative ion-implanted bubble memories are presently being pursued just for this reason because existing equipment is capable of making smaller geometry ion-implanted features (i.e., smaller gaps than Permalloy features). Relatively wide gap bubble propagation paths as disclosed herein permits realization of Permalloy bubble memories with greater packing densities than can be achieved with ion-implanted features.

Figure 5:
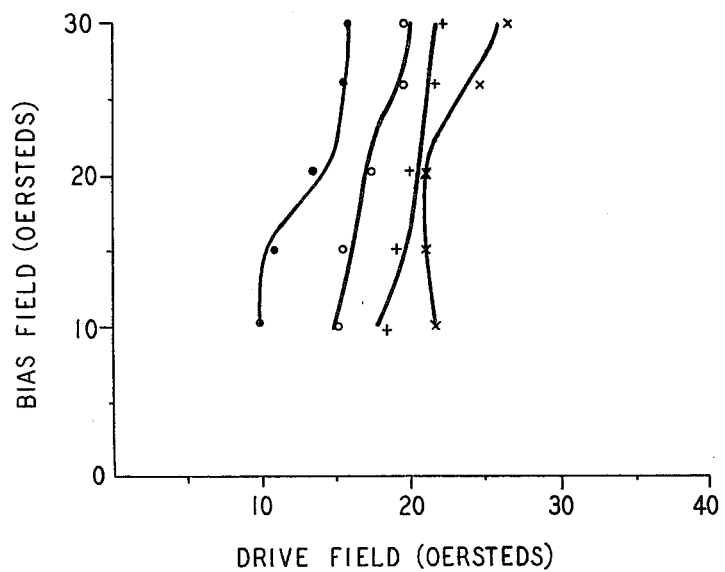
FIG. 5 is a margin plot of a memory test circuit of the type shown in FIG. 3.

Secondly, power requirements are proving to be attractive. Smaller period bubble devices seemed to be characterized by relatively high drive fields with drive fields of 50 oersteds seeming to be common. In contradistinction, bubble memories with patterns tolerant of wide gaps as disclosed herein are characterized by relatively low drive fields. FIG. 5 shows margin data for elements of the type shown in FIG. 4. The data was taken for a square array of elements of the type shown in FIG. 4 having top (.), left (x), bottom (o), and right (+) legs. The legend in the figure corresponds to these designations. The vertical axis represents bias field and the horizontal axis represents drive field. It can be seen that low drive fields and wide margins are achieved.

This margin data is representative of data taken on a significant number of samples. The particular data was taken with bubble tests circuits having 6000 Angstrom units (Angstrom) of $S_1O_2$ and 2000 Angstrom of Permalloy. The thicknesses of both the $S_1O_2$ and Permalloy layers have been varied with similar results.

What has been described is considered merely illustrative of the principles of this invention. Consequently various modifications can be devised by those skilled in the art in accordance with those principles within the spirit and scope of this invention as encompassed by the following claims.

I claim:

1. A magnetic bubble memory comprising a host layer in which magnetic bubbles can be moved, said bubbles having a collapse diameter d in the presence of a bias field at a collapse value, means for providing a magnetic field reorienting in the plane of bubble movement, propagation means for defining in said host layer at least one path along which bubbles can be moved, said propagation means comprising a repetitive pattern of magnetically soft elements responsive to said in-plane field to exhibit changing pole patterns, said memory being CHARACTERIZED IN THAT adjacent ones of said elements have geometries and orientations to form a field gradient encompassing said adjacent elements said gradient being operative to move a bubble in said gradient from one element to the adjacent element.

2. A memory in accordance with claim 1 wherein said elements are made of Permalloy and are spaced apart by gaps g>d.

3. A memory in accordance with claim 2 wherein said elements define paths organized into a major-minor arrangement.

4. A memory in accordance with claim 3 wherein each of said elements comprises at least first and second segments joined at an angle, said elements being oriented at an angle with respect to the axis of the bubble path defined thereby.

5. A memory in accordance with claim 4 wherein said segments have different lengths.

6. A memory in accordance with claim 3 wherein said elements have first, second, and third legs forming a "pickaxe" shape.

* * * * *